United States Patent [19]

Baskett

[11] Patent Number: 4,712,193

[45] Date of Patent: Dec. 8, 1987

[54] CURRENT STEERING DIFFERENTIAL WRITE CIRCUIT FOR MEMORY CELLS

[75] Inventor: Ira E. Baskett, Tempe, Ariz.

[73] Assignee: Motorola, Inc., Schaumburg, Ill.

[21] Appl. No.: 800,240

[22] Filed: Nov. 21, 1985

[51] Int. Cl.$^4$ .................................................. G11C 7/00
[52] U.S. Cl. ..................................................... 365/190
[58] Field of Search ............... 365/154, 155, 156, 189, 365/190, 205

[56] References Cited

U.S. PATENT DOCUMENTS 4,398,268 8/1983 Toyoda ............................... 365/155

Primary Examiner—James W. Moffitt
Attorney, Agent, or Firm—William E. Koch

[57] ABSTRACT

A current steering differential write circuit is provided that creates a narrow write pulse width without affecting the read threshold of a memory array. The memory array includes a first voltage terminal, a second voltage terminal, a plurality of word lines, a plurality of current drain lines, a plurality of bit lines, and a plurality of memory cells, wherein the plurality of memory cells are arranged in a matrix of rows and columns. A word line driver circuit is coupled between the first voltage terminal and one of the word lines of each of the rows for selectively applying voltage to the one of the word lines. A current drain circuit is coupled between one of the current drain lines of each of the rows and the second voltage terminal for sinking current from the one of the current drain lines. A sense amplifier is coupled to the bit lines of each of the columns for sensing current in the bit lines. A decoder circuit is coupled to the bit lines for enabling current through the bit lines. A current source is coupled between the second voltage terminal and each of the decode circuits for sinking a read current through the bit lines of each column. The current steering differential write circuit is coupled between the first voltage terminal and the current source and is responsive to the sense amplifier for removing the read current from one of the bit lines during a write mode.

10 Claims, 1 Drawing Figure

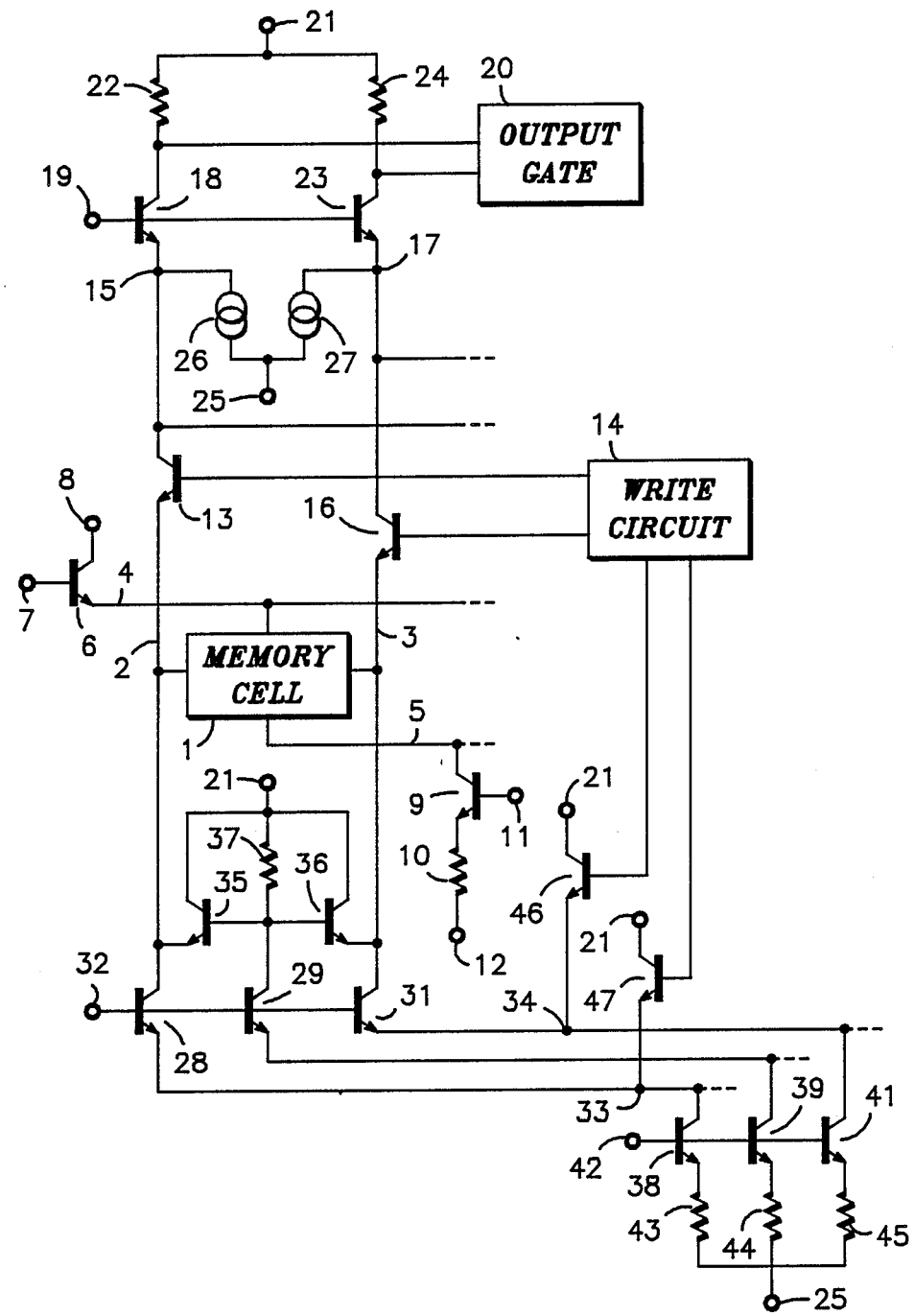

CURRENT STEERING DIFFERENTIAL WRITE CIRCUIT FOR MEMORY CELLS

FIELD OF THE INVENTION

This invention relates generally to bipolar memory cells and, more particularly, to a current steering differential write circuit that provides a narrow write pulse width without affecting the read threshold.

BACKGROUND OF THE INVENTION

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

A row of cells is selected when increased voltage is supplied to the upper word line. A particular cell in that row is read by a sense amplifier coupled to the bit lines. A first read current through one bit line flows directly from the sense amplifier. A second read current through the other bit line flows through one side of the memory cell from the upper word line. When a cell is written, the first read current is directed through the cell and the second read current is directed from the sense amplifier.

There are generally two types of previously known write circuits: single ended and differential. The single ended write circuit pulls down the base of a first sense amplifier device while the base of a second sense amplifier device remains at a read threshold with a read current flowing in the memory cell until it is almost fully written. The differential write circuit raises the base of the second sense amplifier device to remove the read current from the memory cell.

Previously known differential write circuits included current sources coupled between the memory cell and ground by the bit lines. A first and a second decode transistor have their collector-emitter path coupled between the bit lines and the current sources, respectively, and are biased by a column decode circuit for steering write currents through the bit lines. A sense amplifier is coupled to the bit lines above the memory cell for sensing which side of the cell has been written. The read current for the "on" side of the memory cell goes to zero. The sense amplifier typically comprises a first and second transistor, each having an emitter connected to one of the bit lines for supplying current thereto, a base connected to a write circuit for biasing one of the first or second transistors during the write mode, and a collector connected to a first and a second node, respectively. A third and fourth transistor have their bases connected to a bias voltage, their emitters connected to the first and second nodes, respectively, and their collectors coupled to a first supply voltage terminal by a first and second resistor, respectively. The first and second nodes are coupled to a second supply voltage terminal by a first and second current source, respectively. The collectors of the third and fourth transistors are further connected to an output gate for providing an output signal.

However, the voltage on one side of the sense amplifier must be taken towards the upper supply voltage to remove the read current from the "on" side of the memory cell, but there generally is not enough voltage differential to allow this due to the presence of the third and fourth transistors.

Therefore, a current steering differential write circuit is needed that forces one side of the sense amplifier down while diverting current from the other bit line to improve cell response to the write signal.

SUMMARY OF THE INVENTION

Accordingly, it is an object of the present invention to provide an improved current steering differential write circuit.

Another object of the present invention to provide a current steering differential write circuit for memory cells that provides a narrow write pulse.

Yet another object of the present invention is to provide a current steering differential write circuit for memory cells that provides a narrow write pulse without affecting other circuit parameters.

Still another object of the present invention to provide a current steering differential write circuit for memory cells that simultaneously provides a write pulse to one side of the memory cell and steers current from the other side of the memory cell.

In carrying out the above and other objects of the invention in one form, there is provided an improved current steering differential write circuit for a memory circuit. The memory circuit includes a first voltage terminal, a second voltage terminal, a plurality of word lines, a plurality of current drain lines, a plurality of bit lines, and a plurality of memory cells, wherein the plurality of memory cells are arranged in a matrix of rows and columns. Each of the cells in a row are coupled between one of the word lines and one of the current drain lines, and each of the cells in a column are coupled between a pair of the bit lines. A word line driver circuit is coupled between the first voltage terminal and one of the word lines of each of the rows for selectively applying voltage to the one of the word lines. A current drain circuit is coupled between one of the current drain lines of each of the rows and the second voltage terminal for sinking current from the one of the current drain lines. A sense amplifier is coupled to the bit lines of each of the columns for sensing current in the bit lines. A decoder circuit is coupled to the bit lines for enabling current through the bit lines. A current source is coupled between the second voltage terminal and each of the decoder circuits for sinking a read current through the bit lines of each column. The current steering differential write circuit is coupled between the first voltage terminal and the current source and is responsive to the sense amplifier for removing the read current from one of the bit lines during a write mode.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the invention.

DETAILED DESCRIPTION OF THE INVENTION

Referring to the single figure, memory cell 1 is coupled between bit lines 2 and 3, and between word line 4 and current drain line 5, in a manner well known to those skilled in the art. In actuality, a plurality of memory cells 1 are coupled both between word line 4 and current drain line 5, and between bit lines 2 and 3, as reflected by the dotted lines.

There are many types of memory cells known in the art. Memory cell 1 may comprise any one of these types of known memory cells or any later designed innovative memory cell.

Transistor 6 has a base coupled to terminal 7 for receiving a row decode signal, a collector connected to supply voltage terminal 8, and an emitter connected to word line 4. Transistor 6 supplies current to that particular row of memory cells when selected by the application of the row decode signal. Transistor 9 has a collector connected to current drain line 5 for draining current from memory cell 1, a base connected to terminal 11 for receiving bias voltage $V_{BB}$, and an emitter coupled to supply voltage terminal 12 by resistor 10.

Transistor 13 has an emitter connected to bit line 2, a base connected to write circuit 14, and a collector connected to node 15. Transistor 16 has an emitter connected to bit line 3, a base connected to write circuit 14, and a collector connected to node 17. Transistor 18 has a base coupled to terminal 19 for receiving bias voltage $V_{BB'}$, an emitter connected to node 15, and a collector connected both to supply voltage terminal 21 by resistor 22 and to output gate 20. Transistor 23 has a base coupled to terminal 19 for receiving bias voltage $V_{BB'}$, an emitter connected to node 17, and a collector connected both to supply voltage terminal 21 by resistor 24 and to output gate 20. Nodes 15 and 17 are further coupled to supply voltage terminal 25 by current sources 26 and 27, respectively. The collectors of transistors 13 and 16 of each column in the matrix of memory cells are connected to the emitters of transistors 18 and 23.

Transistors 28, 29 and 31 have their bases connected to terminal 32 for a receiving column decode signal. Transistor 28 has a collector connected to bit line 2 and an emitter connected to node 33. Transistor 31 has a collector connected to bit line 3 and an emitter connected to node 34. The selection of a particular column is made by the application of the column decode signal for that column.

Transistor 29 has a collector connected to the bases of transistors 35 and 36 and coupled to supply voltage terminal 21 by resistor 37. Transistors 38, 39, and 41 have their bases connected to terminal 42 for receiving current source bias voltage $V_{CS}$, their emitters coupled to supply voltage terminal 25 by resistors 43, 44 and 45, respectively, and their collectors connected to node 33, the emitter of transistor 29, and node 34, respectively.

In accordance with the present invention, transistor 46 has a collector connected to supply voltage terminal 21, an emitter connected to node 34, and a base connected to write circuit 14. Transistor 47 has a collector connected to supply voltage terminal 21, an emitter connected to node 33, and a base connected to write circuit 14.

In the read mode, one side or the other of the cell is being read. The signals applied to the bases of transistors 13 and 16 are equal for setting the read threshold, and transistors 46 and 47 are off. For instance, the read current through bit line 2 flows from terminal 25 through transistors 38 and 28 and through memory cell 1 to transistor 6 and terminal 8. The read current through bit line 3 from terminal 25 would flow through transistors 41 and 31 and through transistors 16 and 23.

When switching to the write mode, write circuit 14 will pull the base of either transistor 13 or 16 down, preventing current from flowing to respective resistor 22 or 24 from the respective bit line 2 or 3. Instead, current will flow in the "off" side of memory cell 1, writing it to the opposite state.

Write circuit 14 will also bias the respective other of transistors 46 or 47 to divert current from current source transistor 38 or 41 in order to remove read current from the bit line 2 or 3 and the on side of the memory cell.

By now it should be appreciated that there has been provided a current steering differential write circuit that provides a narrow write pulse width without affecting the read threshold.

I claim:

1. A memory circuit having a read mode and a write mode, including a first voltage terminal and a second voltage terminal, said circuit comprising:
   a word line;
   a current drain line;
   a first bit line;
   a second bit line;
   a memory cell coupled between said word line and said current drain line and coupled between said first and second bit lines;
   first means coupled between said first voltage terminal and said first word line for selectively applying voltage to first word line;
   second means coupled between said current drain line and said second voltage terminal for sinking current from said current drain line;
   third means coupled to said first and second bit lines for sensing current in said first and second bit lines;
   fourth means coupled to said first and second bit lines for enabling current through said first and second bit lines;
   fifth means coupled between said second voltage terminal and both said first and second bit lines for sinking a read current through said first and second bit lines; and
   sixth means coupled between said first voltage terminal and said fifth means for supplying current to said fifth means when said memory cell is in said write mode.

2. The circuit according to claim 1 wherein said third means comprises:
   a write circuit coupled to said sixth means;
   a first transistor coupled between said first voltage terminal and said first bit line and having a control electrode coupled to said write circuit; and
   a second transistor coupled between said first voltage terminal and said second bit line and having a control electrode coupled to said write circuit.

3. The circuit according to claim 2 wherein said fifth means comprises:
   a third transistor coupled between said fourth means and said second voltage terminal and having a control electrode coupled for receiving a reference voltage; and
   a fourth transistor coupled between said fourth means and said second voltage terminal and having a control electrode coupled for receiving a reference voltage.

4. The circuit according to claim 3 wherein said sixth means comprises:
   a fifth transistor coupled between said first voltage terminal and a node between said fourth means and said fourth transistor, and a control electrode coupled to said write circuit; and a sixth transistor coupled between said first voltage terminal and a node between said fourth means and said third transistor, and a control electrode coupled to said write circuit.

5. The circuit according to claim 4 wherein said fourth means comprises:

a seventh transistor coupled between said first bit line and said third transistor and having a control electrode coupled for receiving a column decode signal; and an eighth transistor coupled between said second bit line and said fourth transistor and having a control electrode coupled for receiving said column decode signal.

6. A current steering differential write circuit for a memory circuit, said memory circuit including a first voltage terminal, a second voltage terminal, a plurality of word lines, a plurality of current drain lines, a plurality of bit lines, a plurality of memory cells, wherein said plurality of memory cells are arranged in a matrix of rows and columns, each of said cells in a row coupled between one of said word lines and one of said current drain lines, each of said cells in a column coupled between a pair of said bit lines, a plurality of first means, each of said first means coupled between said first voltage terminal and one of said word lines of each of said rows for selectively applying voltage to said one of said word lines, a plurality of second means, each of said second means coupled between one of said current drain lines of each of said rows and said second voltage terminal for sinking current from said one of said current drain lines, a plurality of third means, each of said third means coupled to said bit lines of each of said columns for sensing current in said bit lines, a plurality of fourth means, each of said fourth means coupled to said bit lines for enabling current through said bit lines, a plurality of fifth means, each of said fifth means coupled between said second voltage terminal and each of said fourth means for sinking a read current through said bit lines of each column, said current steering differential write circuit comprising:

sixth means coupled between said first voltage terminal and said fifth means and responsive to said fifth means for removing said read current from one of said bit lines during a write mode.

7. The circuit according to claim 6 wherein said third means comprises:

a write circuit coupled to said sixth means;

a first transistor coupled between said first voltage terminal and said first bit line and having a control electrode coupled to said write circuit; and a second transistor coupled between said first voltage terminal and said second bit line and having a control electrode coupled to said write circuit.

8. The circuit according to claim 7 wherein said fifth means comprises:

a third transistor coupled between said fourth means and said second voltage terminal and having a control electrode coupled for receiving a reference voltage; and a fourth transistor coupled between said fourth means and said second voltage terminal and having a control electrode coupled for receiving a reference voltage.

9. The circuit according to claim 8 wherein said sixth means comprises:

a fifth transistor coupled between said first voltage terminal and a node between said fourth means and said fourth transistor, and a control electrode coupled to said write circuit; and a sixth transistor coupled between said first voltage terminal and a node between said fourth means and said third transistor, and a control electrode coupled to said write circuit.

10. The circuit according to claim 9 wherein said fourth means comprises:

a seventh transistor coupled between said first bit line and said third transistor and having a control electrode coupled for receiving a column decode signal; and an eighth transistor coupled between said second bit line and said fourth transistor and having a control electrode coupled for receiving said column decode signal.

* * * * *